United States Patent
Kawamura et al.

(10) Patent No.: US 11,825,739 B2
(45) Date of Patent: Nov. 21, 2023

(54) BORON-CONTAINING COMPOUND AND ORGANIC LIGHT-EMITTING DIODE

(71) Applicant: FLASK Corporation, Yonezawa (JP)

(72) Inventors: Hisayuki Kawamura, Yonezawa (JP); Masahiro Igarashi, Yonezawa (JP)

(73) Assignee: FLASK CORPORATION C/O YONEZAWA CAMPUS, NATIONAL UNIVERSITY CORPORATION YAMAGATA UNIVERSITY, Yonezawa (JP)

(*) Notice: Subject to any disclaimer, the term of this patent is extended or adjusted under 35 U.S.C. 154(b) by 404 days.

(21) Appl. No.: 17/141,256

(22) Filed: Jan. 5, 2021

(65) Prior Publication Data
US 2021/0257553 A1 Aug. 19, 2021

(30) Foreign Application Priority Data
Feb. 13, 2020 (JP) .................. 2020-022398

(51) Int. Cl.
| C09K 11/06 | (2006.01) |
| H10K 85/60 | (2023.01) |
| C07F 5/02 | (2006.01) |
| H10K 50/11 | (2023.01) |
| H10K 101/10 | (2023.01) |

(52) U.S. Cl.
CPC ........... H10K 85/631 (2023.02); C07F 5/027 (2013.01); C09K 11/06 (2013.01); H10K 85/615 (2023.02); H10K 85/6574 (2023.02); C09K 2211/1007 (2013.01); H10K 50/11 (2023.02); H10K 2101/10 (2023.02)

(58) Field of Classification Search
None
See application file for complete search history.

(56) References Cited

U.S. PATENT DOCUMENTS

2019/0207112 A1* 7/2019 Hatakeyama .......... C09K 11/02

FOREIGN PATENT DOCUMENTS

| WO | 2015102118 A1 | 7/2015 |
| WO | 2017188111 A1 | 11/2017 |

* cited by examiner

Primary Examiner — Sudhakar Katakam
Assistant Examiner — Jennifer C Sawyer
(74) Attorney, Agent, or Firm — BUCHANAN INGERSOLL & ROONEY PC

(57) ABSTRACT

Provided is a boron-containing compound suitable for the material of a blue light-emitting diode and an organic light-emitting diode using the same. The boron-containing compound has a structure represented by the formula (1):

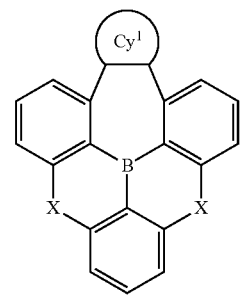

(1)

X is each independently —$NR^1$—, —$CR^2R^3$—, —O— or —S—. In the —$NR^1$— and —$CR^2R^3$—, $R^1$ to $R^3$ are each independently hydrogen, deuterium, an alkyl group having 1 to 6 carbon atoms or an aryl group having 5 to 30 core atoms, and $R^2$ and $R^3$ may connect with each other to form a ring. $Cy^1$ is an aryl group having 5 to 30 core atoms. All or part of hydrogen atoms in the formula (1) may be substituted by deuterium, a halogen, an alkyl group having 1 to 6 carbon atoms, an aryl group having 5 to 30 core atoms, a substituted or unsubstituted silyl group, a substituted or unsubstituted amino group, or cyano group.

14 Claims, 1 Drawing Sheet

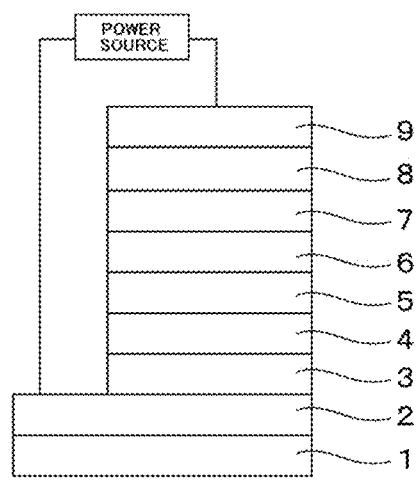

BORON-CONTAINING COMPOUND AND ORGANIC LIGHT-EMITTING DIODE

BACKGROUND OF THE INVENTION

Field of the Invention

The present invention relates to an organic light-emitting diode having a light-emitting layer including a boron-containing compound as a dopant material and an anthracene derivative as a host material.

Description of the Related Art

When a voltage is applied to a pair of electrodes constituting an organic light-emitting diode, holes from an anode and electrons from a cathode are injected into a light-emitting layer including organic compounds as luminescence materials, and the injected electrons and holes are recombined to form exciton in the luminous organic compounds. Consequently, the excited organic compounds emit luminescence. In other words, because of being a self-luminous element, the organic light-emitting diode is superior in brightness and visibility to the liquid crystal element, and gives us a clear image.

The organic light-emitting diode is expected as an light-emitting element which has high luminous efficiency, high resolution, low power consumption, long lifetime and thin profile design, while making use of advantage of the self-luminous element.

In order to improve the performance of the organic light-emitting diode, a host/dopant light-emitting layer in which the host is doped with a luminescence material as the dopant is employed.

In such a light-emitting layer, excitons are effectively generated from the charge injected into the host. The energy of the excitons generated are transferred to the dopant, and thereby the dopant can emit high-efficiency luminance.

Various researches have been conducted on the light-emitting layers, and suitable luminescence materials have been searched so far. For example, a polycyclic aromatic compound in which several aromatic rings are linked through boron, oxygen and so on, has a small decrease of the HOMO-LUMO gap caused by the elongation of the conjugated system, because six membered rings with hetero atoms are less aromatic, and thereby has a large band gap $E_g$; the polycyclic aromatic compound with hetero atoms has smaller exchange interactions between both orbitals because the SOMO 1 and SOMO 2 in the triplet excited state $T_1$ are localized, thereby causing a small energy gap between the triplet excited state $T_1$ and the singlet excited state Si, which leads to generation of thermally activated delayed fluorescence (WO 2015/102118 A1).

WO 2017/188111 A1 also discloses a polycyclic aromatic compound in which several aromatic rings are linked through boron and nitrogen. According to WO 2017/188111 A1, the organic light-emitting diode using both the polycyclic aromatic compound, and an anthracene compound which affords optimal light-emitting characteristics with it, shows low power consumption and high quantum efficiency.

BRIEF SUMMARY OF THE INVENTION

An object of the present invention is to provide a novel blue light-emitting boron compound and a long lifetime organic light-emitting diode including the boron compound.

The boron-containing compound of the present invention has a structure represented by the following general formula (1).

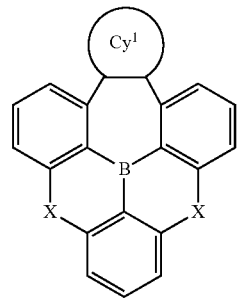

(1)

In the general formula (1), X is each independently —NR$^1$—, —CR$^2$R$^3$—, —O— or —S—. In the —NR$^1$— and —CR$^2$R$^3$—, R$^1$ to R$^3$ are each independently hydrogen, deuterium, an alkyl group having 1 to 6 carbon atoms or an aryl group having 5 to 30 core atoms, and R$^2$ and R$^3$ may connect with each other to form a ring.

Cy$^1$ is an aryl group having 5 to 30 core atoms.

All or part of hydrogen atoms in the structure represented by the general formula (1) may be substituted by deuterium, a halogen, an alkyl group having 1 to 6 carbon atoms, an aryl group having 5 to 30 core atoms, a substituted or unsubstituted silyl group, a substituted or unsubstituted amino group, or cyano group.

To be more concrete, Cy$^1$ is a benzene ring, a naphthalene ring, or a quinoxaline ring represented by the following structural formula. In the structural formula, wavy lines represent the binding site.

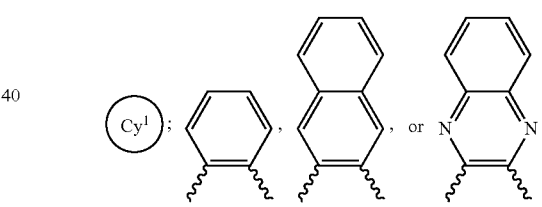

The boron-containing compound of the present invention has a structure represented by the following general formula (2).

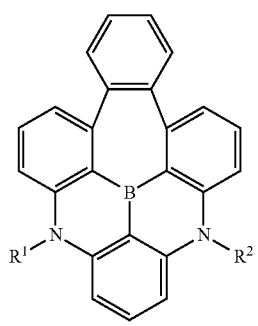

(2)

In the general formula (2), R$^1$ to R$^2$ are each independently an alkyl group having 1 to 6 carbon atoms or an aryl group having 5 to 30 core atoms.

All or part of hydrogen atoms in the structure represented by the general formula (2) may be substituted by deuterium, a halogen, an alkyl group having 1 to 6 carbon atoms, an aryl group having 5 to 30 core atoms, a substituted or unsubstituted silyl group, a substituted or unsubstituted amino group, or cyano group.

The organic light-emitting diode of the present invention comprises the boron-containing compound.

The organic light-emitting diode of the present invention comprises the boron-containing compound in the light emitting zone.

The organic light-emitting diode of the present invention comprises the boron-containing compound in the light-emitting layer.

The organic light-emitting diode of the present invention comprises 0.1 to 20 wt % of the boron-containing compound in the light-emitting layer.

The organic light-emitting diode preferably uses an anthracene derivative as a host in the light-emitting layer.

The organic light-emitting diode preferably uses an anthracene derivative represented by the following general formula (3) as a host in the light-emitting layer.

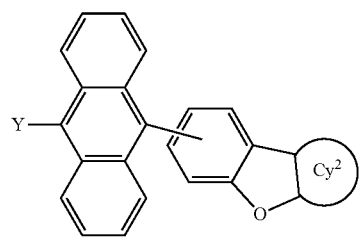

(3)

In the general formula (3), Y is an aromatic cyclic substituent or a nonaromatic cyclic substituent, and $Cy^2$ is an aryl group having 6 to 12 core carbon atoms, preferably a benzene ring or a naphthalene ring.

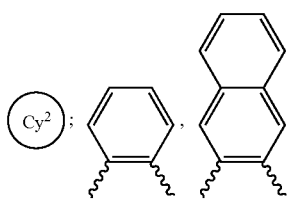

The boron-containing compound of the present invention is a novel compound having an intramolecular seven membered ring with boron. The organic light-emitting diode using the boron-containing compound as blue dopant in its light-emitting layer greatly improves luminous efficiency and lifetime, compared with the former blue light-emitting diodes.

BRIEF DESCRIPTION OF THE DRAWING

FIG. 1 represents the structure of the organic light-emitting diode of the present invention.

DESCRIPTION OF THE EMBODIMENTS

Hereinafter, the present invention will be described in detail.

The boron-containing compound of the present invention has a structure represented by the general formula (1).

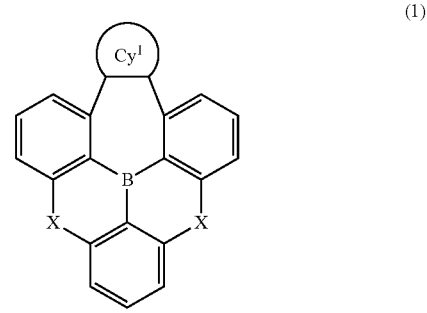

(1)

In the general formula (1), X is each independently amino group (—$NR^1$—), alkylene group (—$CR^2R^3$—), ether bond (—O—) or sulfide bond (—S—). In the —$NR^1$— and —$CR^2R^3$—, $R^1$ to $R^3$ are each independently hydrogen, deuterium, an alkyl group having 1 to 6 carbon atoms or an aryl group having 5 to 30 core atoms.

All or part of hydrogen atoms in the structure of the general formula (1) may be substituted by deuterium, a halogen, an alkyl group having 1 to 6 carbon atoms, an aryl group having 5 to 30 core atoms, a substituted or unsubstituted silyl group, a substituted or unsubstituted amino group, or cyano group.

The alkyl group having 1 to 6 carbon atoms represents a linear or a branched alkyl group.

A specific example includes methyl group, ethyl group, propyl group, isopropyl group, n-butyl group, isobutyl group, s-butyl group, t-butyl group, n-pentyl group, neopentyl group, isopentyl group, s-pentyl group, 3-pentyl group, t-pentyl group, n-hexyl group, 2-methylpentyl group, 3-methylpentyl group, 2,2-dimethylbutyl group and 2,3-dimethylbutyl group.

The aryl group having 5 to 30 core atoms represents a monocyclic or a fused polycyclic aromatic hydrocarbyl group possibly having a substituent. A specific example includes phenyl group, 1-naphthyl group, 2-naphthyl group, p-methoxyphenyl group, p-t-butylphenyl group, p-tolyl group, m-tolyl group, o-tolyl group, pentafluorophenyl group, phenanthryl group, pyrenyl group, fluorenyl group, fluoranthenyl group, pyridyl group, quinoxalyl group, pyrrole group, indolyl group, carbazolyl group, imidazolyl group, benzimidazolyl group, furanyl group, benzofuranyl group, dibenzofuranyl group, thiophenyl group, benzothiophenyl group, dibenzothiophenyl group, benzoxazolyl group, and benzothioxazolyl group.

$R^2$ and $R^3$ may connect with each other to form a ring, such as cyclohexyl group.

$Cy^1$ represents an aryl group having 5 to 30 core atoms. Among the foregoing examples, $Cy^1$ is preferably a benzene ring, a naphthalene ring, and a quinoxaline ring. In the following structural formula, wavy lines represent the binding site.

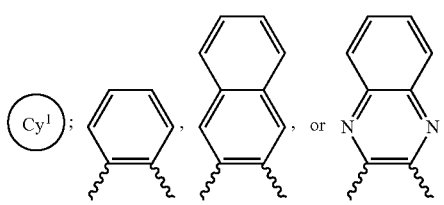

The boron-containing compound of the present invention also includes a structural embodiment represented by the general formula (2).

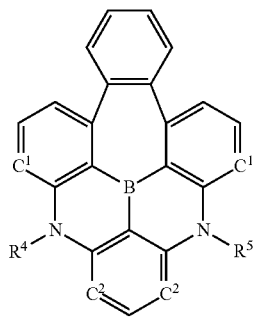
(2)

In the general formula (2), $R^4$ and $R^5$ are each independently an alkyl group having 1 to 6 carbon atoms or an aryl group having 5 to 30 core atoms.

The alkyl group having 1 to 6 carbon atoms and the aryl group having 5 to 30 core atoms are the same as those described for the general formula (1). However, as for the aryl group having 5 to 30 core atoms, in case $R^4$ and $R^5$ are phenyl groups, $C^1$ and $C^2$ may connect with respective carbons on the phenyl groups at the ortho position. $C^1$ and $C^2$ represent a carbon atom.

All or part of hydrogen atoms in the structure of the general formula (2) may be substituted by deuterium, a halogen, an alkyl group having 1 to 6 carbon atoms, an aryl group having 5 to 30 core atoms, a substituted or unsubstituted silyl group, a substituted or unsubstituted amino group, or cyano group.

To be more concrete, the boron-containing compound of the present invention is represented by the following structural formulas.

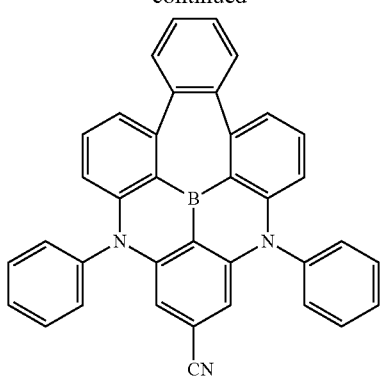

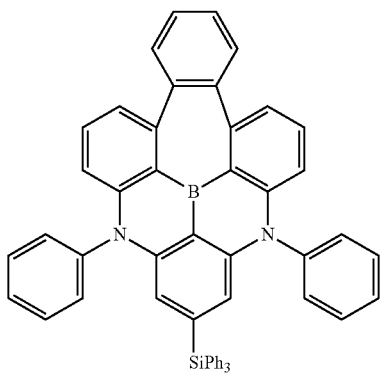

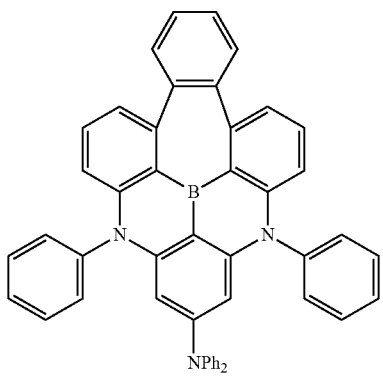

Ph: phenyl group

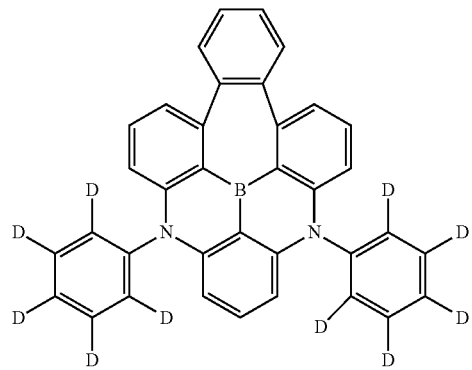

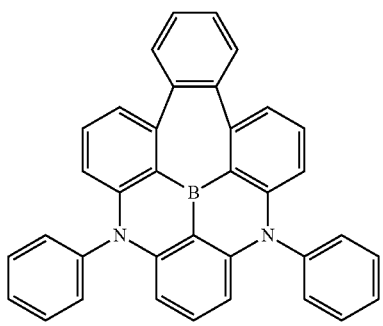

-continued
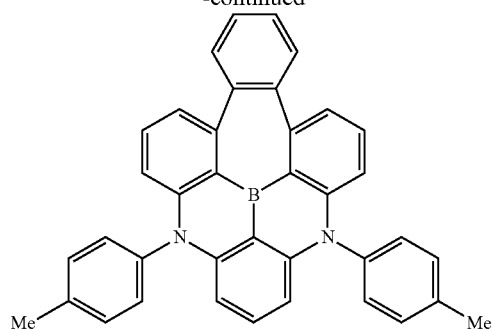
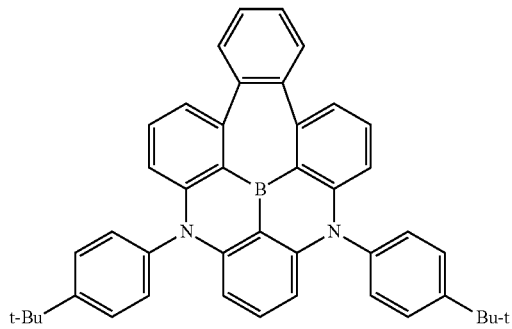
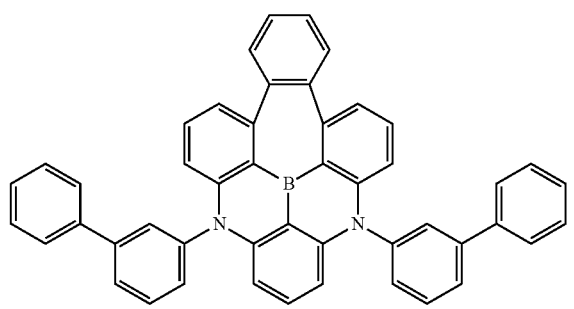
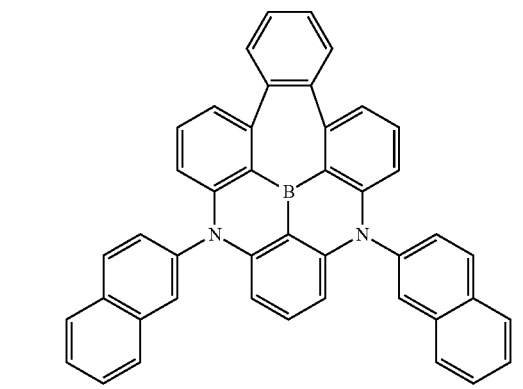
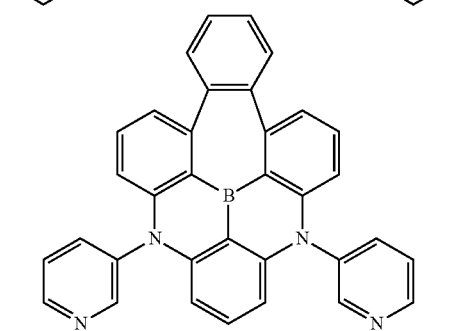
-continued
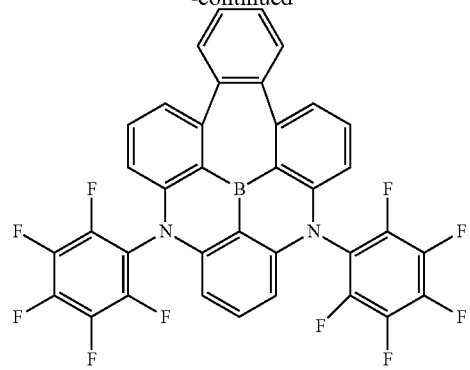
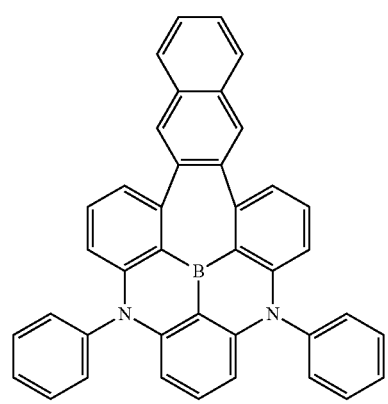
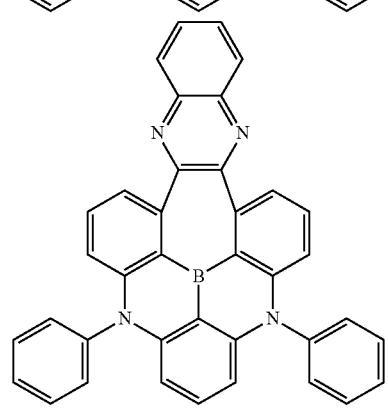
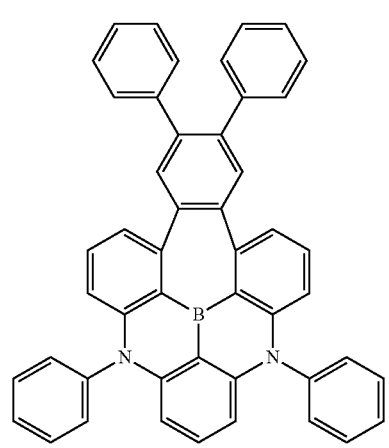

-continued

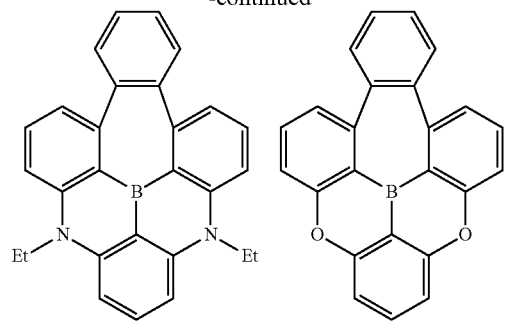

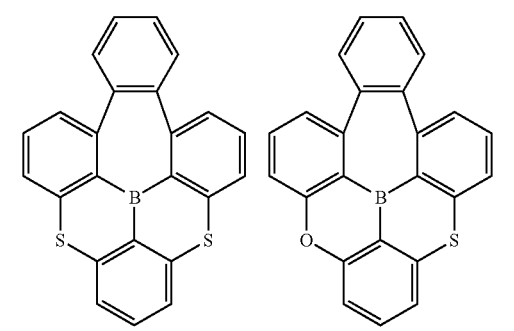

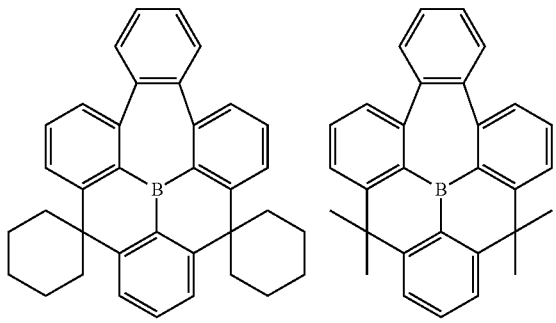

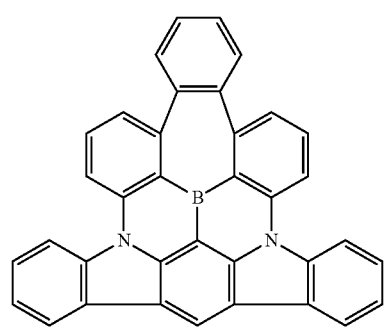

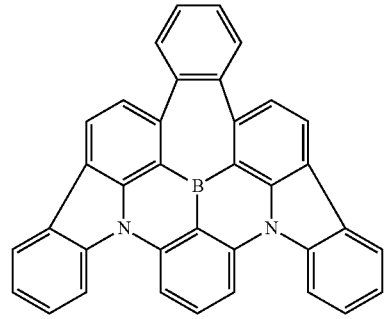

-continued

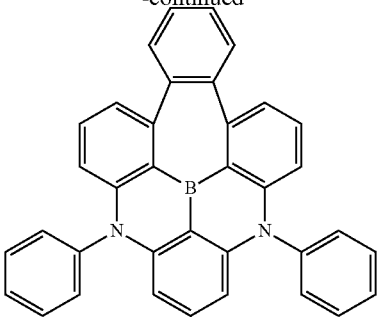

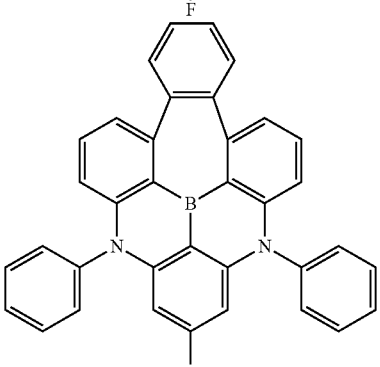

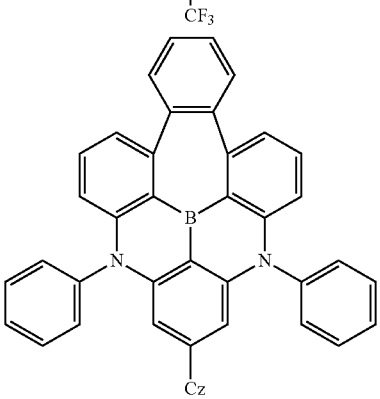

Cz: N-carbazolyl group

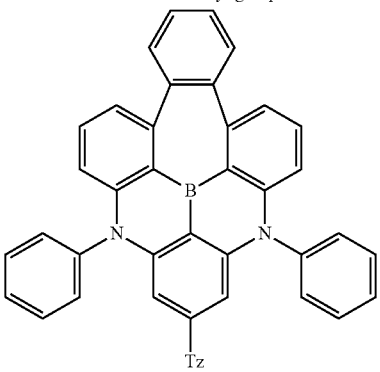

Tz: 2,4,6-triphenyl-1,3,5-triazine group

The boron compound of the present invention has an extended π-conjugated structure. Molecules having π-conjugated systems, which have light absorption bands in the visible light region, are mostly known to work as pigments. But as π-conjugated systems elongate, HOMO ascends and LUMO descends, leading to a decreased HOMO-LUMO gap (band gap $E_g$). The present invention revealed that the polycyclic aromatic compound in which aromatic rings are linked through hetero elements, such as boron, oxygen, nitrogen and sulfur, in other words, the boron compound represented by the general formula (1) or (2) has a wider band gap $E_g$, because moieties including hetero elements suppress the decrease of band gap $E_g$.

The boron compound of the present invention has high triplet excitation energy ($E_T$). The boron compound has a small energy gap ($\Delta E_{ST}$) between an excited singlet state ($E_S$) and an excited triplet state ($E_T$), because of less exchange interaction between SOMO1 and SOMO2 in an excited triplet state due to the electronic perturbation of hetero elements.

In the present invention, the electronic properties of the molecule are adjusted in experimenting with functional groups, which enables the band gap $E_g$ to be controlled, and further, makes the energy gap ($\Delta E_{ST}$) between a singlet state ($E_S$) and a triplet state ($E_T$) as small as possible. Once transferred to the triplet excited state ($E_T$), the energy can be reverted to the excited singlet state ($E_S$) again. And fluorescent light can be extracted with high efficiency.

A variety of known methods can be used in synthesizing the boron compound of the present invention. The following is a method of synthesizing the compound A, which is one of the boron compounds of the present invention.

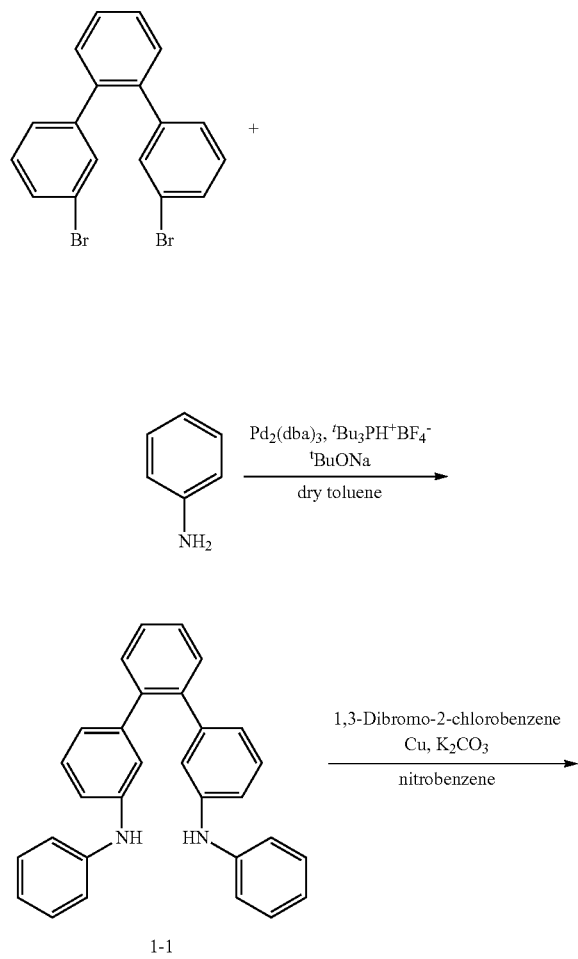

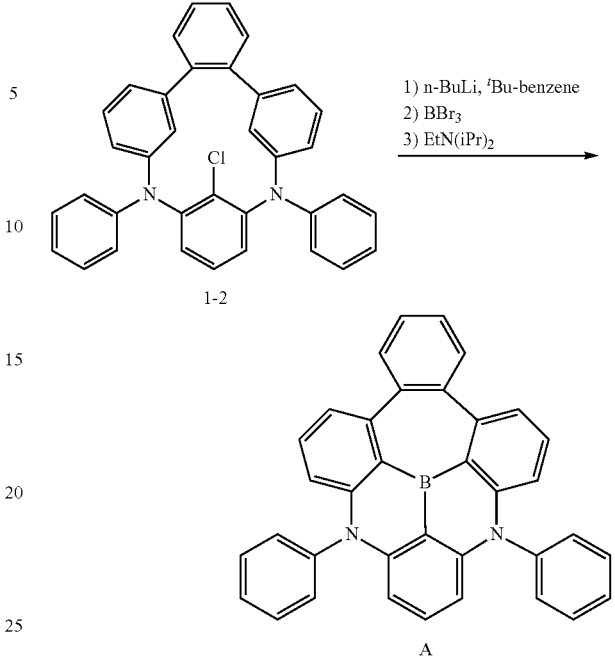

To 3,3"-dibromo-o-terphenyl and aniline are added sodium t-butoxide (tBuONa) and dehydrated toluene, and then bubbled with nitrogen for a while. Tris(dibenzylideneacetone) dipalladium(0) (Pd$_2$ (dba)$_3$) and tri-t-butylphosphonium tetrafluoroborate (tBu$_3$PH$^+$BF$_4^-$) are added to the mixture. The mixture undergoes the cross coupling reaction to form the compound 1-1. Subsequently, 1,3-dibromo-2-chlorobenzene and nitrobenzene are added to the compound 1-1, and the mixture undergoes the reaction in the presence of Cu catalyst and potassium carbonate (K$_2$CO$_3$) to form the compound 1-2. The addition of n-Butyllitium, t-butylbenzene, boron tribromide (BBr$_3$) and N,N'-diisopropylethylamine (EtN(iPr)$_2$) to the compound 1-2, and the subsequent reaction give the compound A in a good yield.

The organic light-emitting diode of the present invention is formed using the boron-containing compound. The boron-containing compound is contained in a light emitting zone of the organic light-emitting diode. The light emitting zone is where a hole recombines with an electron to emit light. The light emitting zone counts as the light-emitting layer 5 in most cases.

The organic light-emitting diode has a structure in which one or two or more organic layers are deposited between electrodes. An embodiment of the structure includes anode 1/hole injection layer 2/hole transport layer 3/light-emitting layer 5/electron transport layer 7/electron injection layer 8/cathode 9, anode 1/hole transport layer 3/light-emitting layer 5/electron transport layer 7/electron injection layer 8/cathode 9, anode 1/hole injection layer 2/light-emitting layer 5/electron transport layer 7/electron injection layer 8/cathode 9, anode 1/hole injection layer 2/hole transport layer 3/light-emitting layer 5/electron injection layer 8/cathode 9, anode 1/hole injection layer 2/hole transport layer 3/light-emitting layer 5/electron transport layer 7/cathode 9, anode 1/light-emitting layer 5/electron transport layer 7/electron injection layer 8/cathode 9, anode 1/hole transport layer 3/light-emitting layer 5/electron injection layer 8/cathode 9, anode 1/hole transport layer 3/light-emitting layer 5/electron transport layer 7/cathode 9, anode 1/hole injection layer 2/light-emitting layer 5/electron injection layer 7/cathode 9, anode 1/hole injection layer 2/light-emitting layer 5/electron transport layer 7/cathode 9, anode 1/light-emitting layer 5/electron transport layer 7/cathode 9, and anode 1/light-emitting layer 5/electron injection layer 8/cathode 9. As shown in FIG. 1, the Example of the present invention shows a structure in which electron barrier layer 4 and hole barrier layer 6 are added to the foregoing configuration; that is to say, the structure in which anode 1/hole injection layer 2/hole transport layer 3/electron barrier layer 4/light-emitting layer 5/hole barrier layer 6/electron transport layer 7/electron injection layer 8/cathode 9 are deposited in this order. The organic layers indicate the layers other than the electrodes 1 and 9; that is to say, hole injection layer 2, hole transport layer 3, electron barrier layer 4, light-emitting layer 5, hole barrier layer 6, electron transport layer 7, electron injection layer 8, etc.

Transparent and smooth materials having a total light transmittance of at least 70% or more are used for the substrate. To be more concrete, the substrate includes flexible transparent substrate, such as glass substrate having a thickness of several microns or special transparent plastic.

Thin films formed on the substrate, such as the anode 1, the hole injection layer 2, the hole transport layer 3, the electron barrier layer 4, the light-emitting layer 5, the hole barrier layer 6, the electron transport layer 7, the electron injection layer 8 and the cathode 9 are formed by a vacuum deposition method or a coating method. In the case of using the vacuum deposition method, the vapor deposition material is usually heated under a reduced pressure of $10^{-3}$ Pa or less. Though the film thickness of each layer is different depending on the type of layers or materials used, the anode 1 and the cathode 9 have thicknesses of approximately 100 nm and the other layers including the light-emitting layer 5 have thicknesses of less than 50 nm.

Materials for the anode 1 have high work function and a total light transmittance of generally 80% or more. To be specific, transparent conductive ceramics such as indium tin oxide (ITO) and zinc oxide (ZnO), transparent conductive polymers such as polythiophene-polystyrene sulfonate (PEDOT-PSS) and polyaniline, and other transparent conductive materials are used to make luminescence emitted from the anode 1 pass through.

In order to transport holes from the anode 1 to the light-emitting layer 5 efficiently, the hole injection layer 2 and the hole transport layer 3 are formed between the anode 1 and the light-emitting layer 5.

The hole injection material constituting the hole injection layer 2 includes poly(arylene ether ketone)-containing triphenylamine (KLHIP:PPBI), 1,4,5,8,9,11-hexaazatriphenylenehexacarbonitrile (HATCN) and PEDOT-PSS. The hole injection layer 2 made of these materials, which is also called the polymer buffer layer, is effective in lowering the drive voltage of the organic light-emitting diode.

The hole transport layer 3 formed between the anode 1 and the light-emitting layer 5 is a layer which transports holes from the anode 1 to the light-emitting layer 5 efficiently. For the hole transport material, the material having a small ionization energy is used, i.e., the material which easily excites electrons from the HOMO and generates holes. An example includes poly(9,9-dioctylfluorene-alt-N-(4-butylphenyl)diphenylamine) (TFB), 4,4'-cyclohexylidenebis[N,N-bis(4-methylphenyl)benzenamine] (TAPC), N,N'-diphenyl-N,N'-di(m-tolyl)benzidine (TPD), N,N'-di(1-naphthyl)-N,N'-diphenylbenzidine (NPD), 4DBFHPB (dibenzofuran end-capped arylamine derivative having a hexaphenylbenzene backbone), 4,4',4''-tri-9-carbazolyltriphenylamine (TCTA) and 4,4',4''-tris[phenyl(m-tolyl)amino]triphenylamine.

The use of a luminescence material with a host is preferable to the light-emitting layer 5, similarly to the other light-emitting layers used for the organic light-emitting diode. Known materials can be widely used for the host, as long as they minimize the charge injection barrier at the hole transport layer 3 and the electron transport layer 7, confine the charge to the light-emitting layer 5, and suppress to quench the light-emitting exciton. In the present invention, the anthracene derivative represented by the general formula (3) is preferably used.

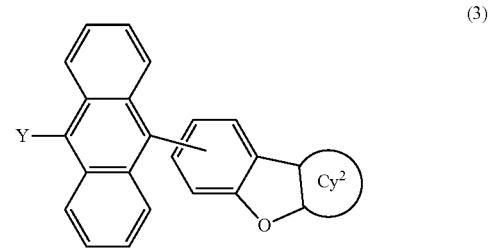

(3)

In the general formula (3), the carbon at 9-position (or 10-position) of anthracene moiety is bonded to the carbon at any of 1 position to 4-position of dibenzofuran moiety.

Y represents an aromatic cyclic substituent or a nonaromatic cyclic substituent. The aromatic cyclic substituent or the nonaromatic cyclic substituent is preferably phenyl group, biphenyl group, naphthyl group and dibenzofuranyl group, and more preferably phenyl group, 1-biphenyl group, 1-naphthyl group and 2-dibenzofuranyl group.

$Cy^2$ represents an aryl group having 6 to 12 core carbon atoms. To be specific, the aryl group having 6 to 12 core carbon atoms is a benzene ring or a naphthalene ring; in other words, the anthracene moiety has a structure of dibenzofuran or benzonaphthofuran at its 10-position (or 9-position).

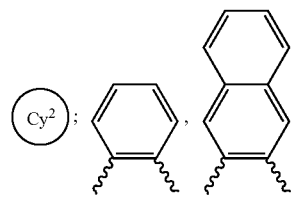

It is desirable that the anthracene derivative represented by the general formula (3) should have the following structural formula.

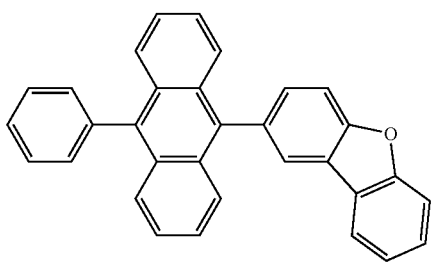

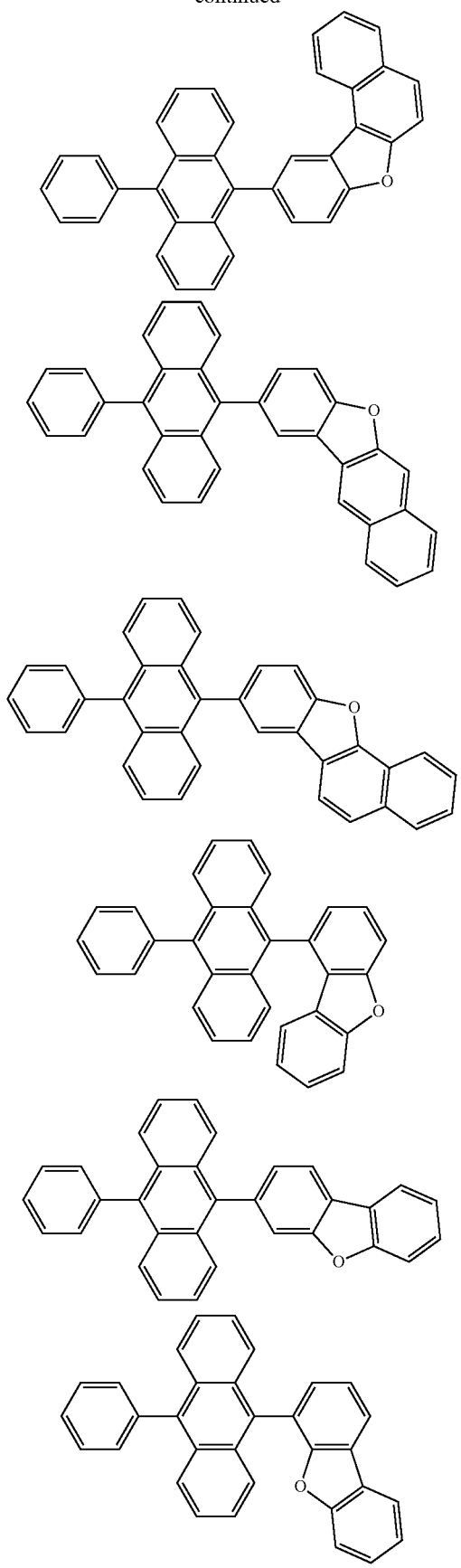

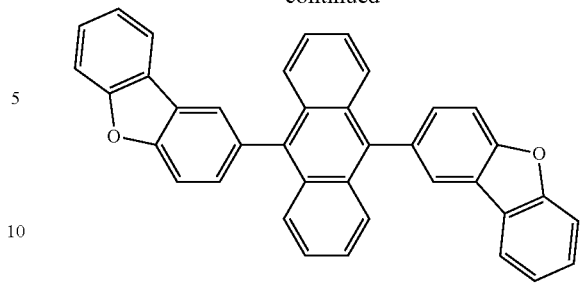

The addition amount of the host is preferably 50 to 99.9 wt % and more preferably 80 to 95 wt % of the total materials for the light-emitting layer 5.

The electron barrier layer 4 can be formed between the light-emitting layer 5 and the hole transport layer 3 as it is needed. By inserting the electron barrier layer 4, electrons are confined to the light-emitting layer and the probability of recombining charges in the light-emitting layer is enhanced, which results in high luminous efficiency. Monoamine derivatives among others are used for the electron barrier material constituting the electron barrier layer 4.

The hole barrier layer 6 and the electron transport layer 7 are formed between the cathode 9 and the light-emitting layer 5 in order to transport electrons efficiently from the cathode 9 to the light-emitting layer 5. The electron transport material constituting the electron transport layer 7 includes 1,4-bis(1,10-phenanthroline-2-yl)benzene (DPB), 8-hydroxyquinolinolatolithium (Liq), 4,6-bis(3,5-di(pyridin-3-yl)phenyl)-2-methylpyrimidine (B3PymPm), 4,6-bis(3,5-di(pyridin-4-yl)phenyl)-2-phenylpyrimidine (B4PyPPm), 2-(4-biphenylyl)-5-(p-t-butylphenyl)-1,3,4-oxadiazole (tBu-PBD), 1,3-bis[5-(4-t-butylphenyl)-2-[1,3,4]oxadiazolyl]benzene (OXD-7), 3-(biphenyl-4-yl)-5-(4-t-butylphenyl)-4-phenyl-4H-1,2,4-triazole (TAZ), bathocuproine (BCP), 1,3,5-tris(1-phenyl-1H-benzimidazol-2-yl)benzene (TPBi) and 3-(4-biphenyl)-4-phenyl-5-(4-t-butylphenyl)-1,2,4-triazole (TAZ). Among these, the mixed layer of DPB and Liq, etc., are preferable.

The hole barrier layer 6 is a layer for high luminous efficiency, where holes are confined in the light-emitting layer 5 and the probability of recombining charges in the light-emitting layer 5 is enhanced. DBT-TRZ among others are used for the hole barrier material constituting the hole barrier layer 6. The hole barrier layer 6 and the electron transport layer 7 have a thickness of generally 3 to 50 nm, being subject to change depending on the intended design.

The electron injection material constituting the electron injection layer 8 includes lithium fluoride (LiF) and lithium 2-hydroxy-(2,2')-bipyridyl-6-yl phenolate (Libpp).

Chemically stable materials having low work function of 4 eV or less are used for the cathode 9. To be more concrete, Al, Mg—Ag alloy, Al-alkali metal alloy (e.g., Al—Li), and Al—Ca alloy are used for the cathode material. These cathode materials are filmed by resistance heating evaporation, electron beam evaporation, sputtering, or ion plating, for instance.

EXAMPLES

Hereinafter, the present invention will be described in detail with reference to examples, but the present invention is not restricted to the examples.

Example 1

[Synthesis of the Boron-Containing Compound]
(i) Synthesis of the Compound 1-1

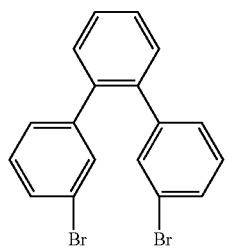

+

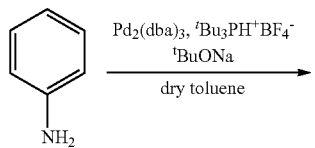

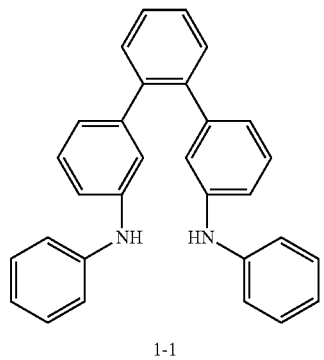

To a 300 mL four-necked flask equipped with a stirring bar were added 10.00 g (25.8 mmol) of 3,3″-dibromo-o-terphenyl, 2.40 g (25.8 mmol) of aniline (special grade), 12.40 g (129 mmol) of sodium tert-butoxide, and 250 ml of dehydrated toluene. After bubbling with nitrogen for 1 hour, 0.95 g (1.0 mmol) of tris(dibenzylideneacetone)dipalladium (0) and 0.58 g (2.0 mmol) of tri-tert-butylphosphonium tetrafluoroborate were added to the mixture, and the mixture was refluxed for 12 hours. Thin-layer chromatography (TLC) confirmed the disappearance of the starting materials in the reaction mixture. The reaction mixture was extracted with toluene, and the resulting extract was washed with brine and dried with MgSO₄. The solvent was removed by evaporation, and the residue was chromatographed on silica gel to give 6.60 g (16.0 mmol) of the compound 1-1 in 62% yield.

(ii) Synthesis of the Compound 1-2

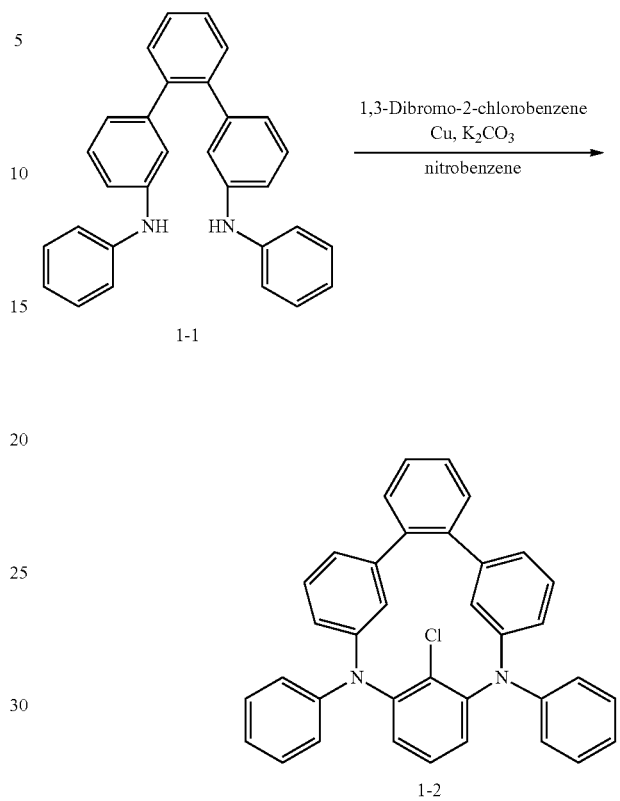

To a 100 mL four-necked flask equipped with a stirring bar were added 6.60 g (16.0 mmol) of the compound 1-1, 4.75 g (17.6 mmol) of 1,3-dibromo-2-chlorobenzene, 1.00 g (15.7 mmol) of copper powder, 6.60 g (47.8 mmol) of potassium carbonate, and 100 ml of nitrobenzene, and the mixture was refluxed under nitrogen for 12 hours. After confirmed by TLC, the reaction mixture was returned to room temperature. The organic layer was extracted with dichloromethane, and the resulting extract was washed with brine and dried with MgSO₄. The solvent was removed by evaporation. The residue was chromatographed on silica gel to give 2.58 g (5.00 mmol) of the compound 1-2 in 31% yield.

(iii) Synthesis of the Compound A (the Boron-Containing Compound)

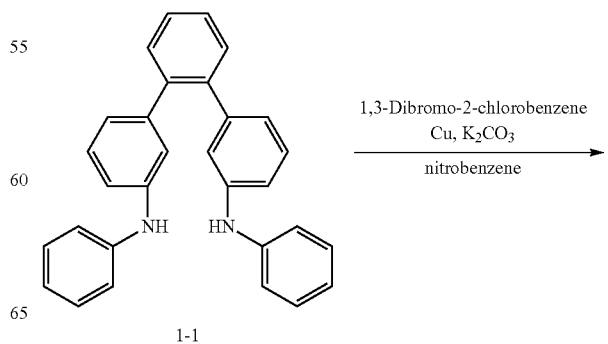

-continued

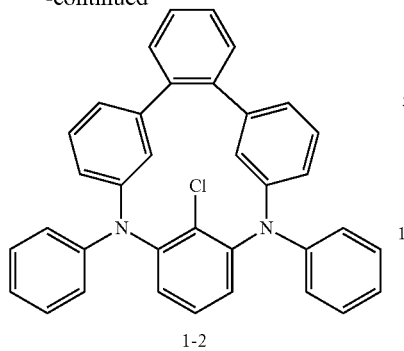

1-2

To a 100 mL four-necked flask equipped with a stirring bar were added 2.58 mg (5.00 mmol) of the compound 1-2 and 50 ml of t-butylbenzene, and the mixture was cooled at 0° C. under nitrogen. After 3.3 ml of n-butyllithium hexane solution (1.64M, 5.4 mmol) was added thereto, the mixture was stirred at room temperature for 2 hours. Then, 0.71 ml (7.5 mmol) of boron tribromide was added at 0° C. or less and the mixture was stirred at room temperature for 20 hours. Then, 1.74 ml (10.0 mmol) of N,N-diisopropylethylamine was added at 0° C. or less. The mixture was stirred at 100° C. for 2 hours under nitrogen to remove hexane and then stirred at 130° C. for 8 hours. After heated furthermore at 150° C. for 20 hours, the mixture was cooled to 0° C. or less, and 1.74 ml (10.0 mmol) of N,N-diisopropylethylamine was added thereto. Toluene was added, the resulting mixture was separated on florisil, and the solvent was evaporated. The obtained residue was chromatographed on silica gel to give 790 mg (1.60 mmol) of the compound A in 32% yield.

FD-MS (field ionization mass spectrometry) showed a mass spectrum of m/z 494.4, by which the obtained compound A was identified as a structural formula as described above.

[Manufacturing and Evaluation of Elemental Device]

A glass substrate of 26 mm×28 mm×0.7 mm (manufactured by Opto Science Inc.,), on which ITO was sputtered to a thickness of 180 nm and then polished to 150 nm, was used as a transparent support substrate.

The transparent support substrate was fixed to a substrate holder of a commercially available deposition apparatus (manufactured by Showa Shinku Co., Ltd.). The deposition apparatus was equipped with a vapor deposition boat made of molybdenum containing HIM (hole injection material), a vapor deposition boat made of molybdenum containing HTM (hole transport material), a vapor deposition boat made of molybdenum containing EBL (electron barrier material), a vapor deposition boat made of molybdenum containing BH1 (host), a vapor deposition boat made of molybdenum containing the compound A of the present invention, a vapor deposition boat made of molybdenum containing HBL (hole barrier material), a vapor deposition boat made of molybdenum containing ETM (electron transport material), a vapor deposition boat made of molybdenum containing LiF, and a vapor deposition boat made of molybdenum containing aluminum. The structural formula of each material is as follows.

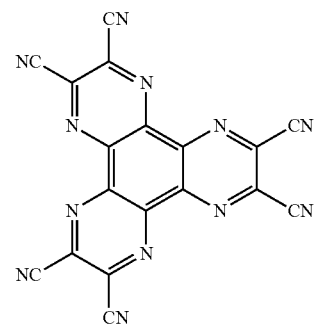

HIM

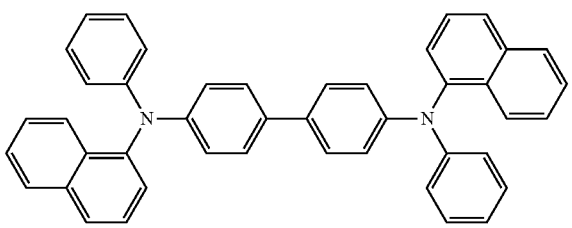

HTM

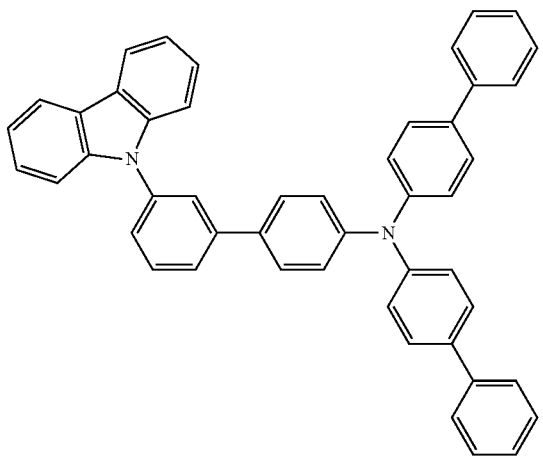

EBL

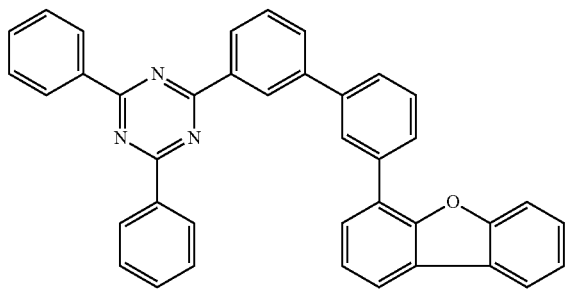

HBL

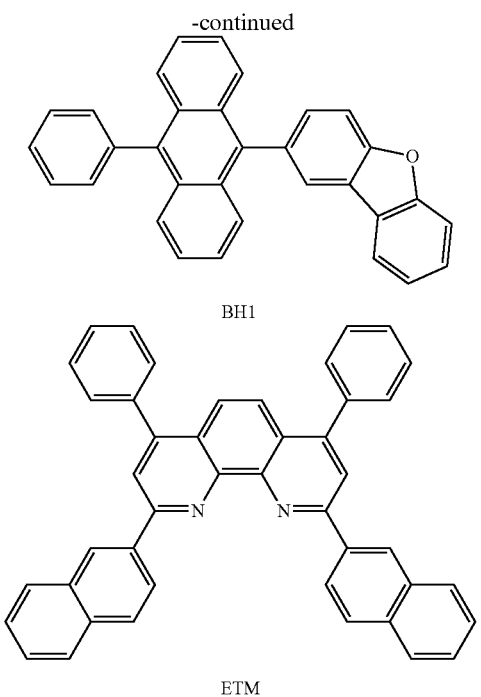

BH1

ETM

Each layer was successively formed on the ITO film of the transparent support substrate as described below. The inside pressure of a vacuum chamber was reduced to 5×10⁻⁴ Pa, and first of all, the vapor deposition boat containing HIM was heated so that HIM could vaporize and form the hole injection layer 2 with a thickness of 5 nm. Next, the vapor deposition boat containing HTM was heated so that HTM could vaporize and form the hole transport layer 3 with a thickness of 105 nm. The vapor deposition boat containing the EBL was heated so that EBL could vaporize and form the electron barrier layer 4 with a thickness of 20 nm.

Next, the vapor deposition boat containing BH1 and the one containing the compound A were heated at the same time, and the light-emitting layer 5 was vapor deposited with a thickness of 25 nm. The vapor deposition rate was controlled so as to give a weight ratio of BH1 and the compound A at approximately 80:20.

Then, the vapor deposition boat containing HBL was heated so that HBL could vaporize and form the hole barrier layer 6 with a thickness of 20 nm. And the vapor deposition boat containing ETM was heated so that ETM could vaporize and form the electron transport layer 7 with a thickness of 10 nm.

The vapor deposition rate of each layer was 0.01 to 2 nm/s.

After that, the vapor deposition boat containing LiF, the material to form the electron injection layer 8, was heated, and LiF was vapor deposited to a thickness of 1 nm at a vapor deposition rate of 0.01 to 0.1 nm/s. Subsequently, the vapor deposition boat containing aluminum was heated, and the cathode 9 was formed with a thickness of 100 nm at a vapor deposition rate of 0.01 to 2 nm/s, which led to the organic light-emitting diode.

When the direct current was applied on the elemental device with an ITO electrode as the anode 1 and a LiF/aluminum electrode as the cathode 9, blue light emission was observed.

The elemental device was driven by a constant current at an initial luminance of 1000 nit, and the time until the luminance reached 95% was measured.

Comparative Example 1

The elemental device was prepared in a manner similar to Example 1, except that the compound represented by the following structural formula was used instead of the compound A.

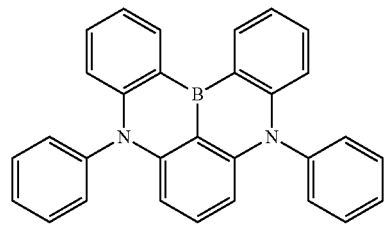 [SMILES: c1ccc(N2c3ccccc3B3c4ccccc4N(c4ccccc4)c4cccc2c43)cc1]

When the direct current was applied on the elemental device with an ITO electrode as the anode and a LiF/aluminum electrode as the cathode, blue light emission was observed.

The elemental device was driven by a constant current at an initial luminance of 1000 nit, and the time until the luminance reached 95% was measured.

TABLE 1

|  | Relative values, when the time measured in Comparative Example 1 was set at 100. |
|---|---|
| Example 1 | 145 |
| Comparative Example 1 | 100 |

The compound of the present invention is superior in maintaining longer lifetime blue light emission to that of the prior art.

The invention claimed is:

1. A boron-containing compound having a structure represented by the following general formula (1):

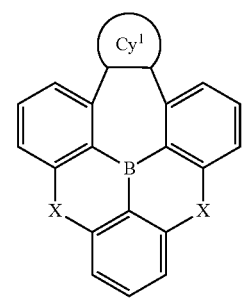

in the general formula (1), X is each independently —NR¹—, —CR²R³—, —O— or —S—, wherein R¹ to R³ are each independently hydrogen, deuterium, an alkyl group having 1 to 6 carbon atoms or an aryl group having 5 to 30 core atoms, and R² and R³ may connect with each other to form a ring; Cy¹ is an aryl group having 5 to 30 core atoms; all or part of hydrogen atoms in the structure of the general formula (1) may be substituted by deuterium, a halogen, an alkyl group having 1 to 6 carbon atoms, an aryl group having 5 to 30 core atoms, a substituted or unsubstituted silyl group, a substituted or unsubstituted amino group, or cyano group.

2. A boron-containing compound having a structure represented by the following general formula (2):

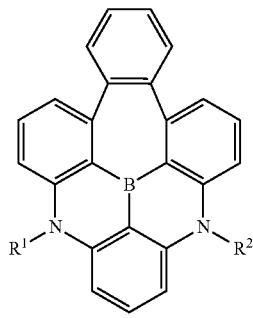

(2)

in the general formula (2), $R^4$ to $R^5$ are each independently an alkyl group having 1 to 6 carbon atoms or an aryl group having 5 to 30 core atoms; and all or part of hydrogen atoms in the structure of the general formula (2) may be substituted by deuterium, a halogen, an alkyl group having 1 to 6 carbon atoms, an aryl group having 5 to 30 core atoms, a substituted or unsubstituted silyl group, a substituted or unsubstituted amino group, or cyano group.

3. An organic light-emitting diode comprising the boron-containing compound according to claim 1.

4. An organic light-emitting diode comprising the boron-containing compound according to claim 2.

5. An organic light-emitting diode comprising the boron-containing compound according to claim 1 in the light emitting zone.

6. An organic light-emitting diode comprising the boron-containing compound according to claim 2 in the light emitting zone.

7. An organic light-emitting diode comprising the boron-containing compound according to claim 1 in the light-emitting layer.

8. An organic light-emitting diode comprising the boron-containing compound according to claim 2 in the light-emitting layer.

9. An organic light-emitting diode comprising 0.1 to 20 wt % of the boron-containing compound according to claim 1 in the light-emitting layer.

10. An organic light-emitting diode comprising 0.1 to 20 wt % of the boron-containing compound according to claim 2 in the light-emitting layer.

11. The organic light-emitting diode according to claim 9, using an anthracene derivative as a host in the light-emitting layer.

12. The organic light-emitting diode according to claim 10, using an anthracene derivative as a host in the light-emitting layer.

13. The organic light-emitting diode according to claim 9, using an anthracene derivative represented by the following general formula (3) as a host in the light-emitting layer:

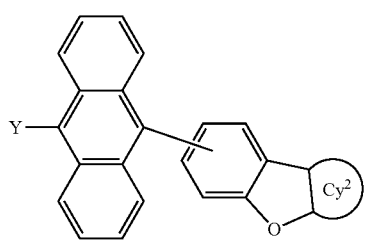

(3)

in the general formula (3), Y is an aromatic cyclic substituent or a nonaromatic cyclic substituent, and $Cy^2$ is an aryl group having 6 to 12 core carbon atoms.

14. The organic light-emitting diode according to claim 10, using an anthracene derivative represented by the following general formula (3) as a host in the light-emitting layer:

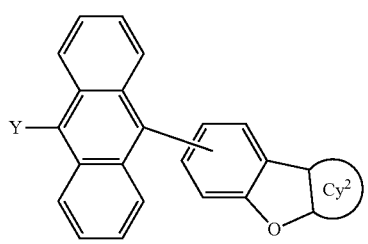

(3)

in the general formula (3), Y is an aromatic cyclic substituent or a nonaromatic cyclic substituent, and $Cy^2$ is an aryl group having 6 to 12 core carbon atoms.

\* \* \* \* \*